(12) United States Patent
Heine et al.

(10) Patent No.: US 7,970,024 B2
(45) Date of Patent: Jun. 28, 2011

(54) TUNABLE DIODE LASER SYSTEM WITH EXTERNAL RESONATOR

(75) Inventors: Thomas Heine, Vienna (AT); Rainer Heidemann, Munich (DE)

(73) Assignee: TOPTICA Photonics AG, Gräfelfing (DE)

( * ) Notice: Subject to any disclaimer, the term of this patent is extended or adjusted under 35 U.S.C. 154(b) by 120 days.

(21) Appl. No.: 12/214,324

(22) Filed: Jun. 18, 2008

(65) Prior Publication Data

US 2009/0034563 A1 Feb. 5, 2009

(30) Foreign Application Priority Data

Jun. 18, 2007 (DE) .................. 10 2007 028 499

(51) Int. Cl.
*H01S 3/10* (2006.01)
(52) U.S. Cl. ............. 372/20; 372/102; 372/96; 372/99; 372/107
(58) Field of Classification Search .................... 372/20, 372/102, 98, 99, 107
See application file for complete search history.

(56) References Cited

U.S. PATENT DOCUMENTS

| | | | |
|---|---|---|---|
| 4,601,452 A | 7/1986 | Rando | |
| 5,802,085 A | 9/1998 | Lefevre et al. | |
| 5,995,521 A | 11/1999 | Moore et al. | |
| 6,018,535 A * | 1/2000 | Maeda | 372/20 |
| 6,026,100 A | 2/2000 | Maeda | |
| 6,304,586 B1 | 10/2001 | Pease et al. | |
| 7,366,221 B2 * | 4/2008 | Tanaka et al. | 372/102 |
| 7,388,890 B2 * | 6/2008 | Le et al. | 372/20 |
| 2006/0227821 A1 | 10/2006 | Klooster | |

FOREIGN PATENT DOCUMENTS

| | | |
|---|---|---|
| DE | 199 35 612 | 5/2000 |
| DE | 198 60 895 | 6/2000 |
| JP | 11-293202 | 10/1999 |

OTHER PUBLICATIONS

Hult, J. et al., "*Wide bandwidth mode-hop-free tuning of extended-cavity GaN diode lasers*," Applied Optics, Jun. 20, 2005, vol. 44, No. 18, pp. 3675-3685. (Spec, p. 5).
European Search Report with English translation, Sep. 4, 2008.

* cited by examiner

*Primary Examiner* — Kinam Park
(74) *Attorney, Agent, or Firm* — Collard & Roe, P.C.

(57) ABSTRACT

A tunable diode laser system with external resonator in Littrow or Littman configuration has an optical lattice on which the light beam from a laser diode is diffracted, a support element to hold the lattice or to hold a mirror, which reflects the light diffracted by the lattice, and an actuator to change the position of the lattice or the mirror. The tunable diode laser system enables a reliable mode-hop-free tuning and furthermore is easy and economical to realize by having the support element include a carrier, on which the lattice or the mirror is arranged, and a base body, while the actuator acts on the carrier and rests against the base body. The carrier is connected to the base body via linkages, such that a linear deflection of the actuator is transformed into a rotation of the carrier in the plane of the light beam, while the center of rotation lies outside the base body.

20 Claims, 3 Drawing Sheets

TUNABLE DIODE LASER SYSTEM WITH EXTERNAL RESONATOR

CROSS REFERENCE TO RELATED APPLICATIONS

Applicants claim priority under 35 U.S.C. §119 of German Application No. 10 2007 028 499.5 filed Jun. 18, 2007.

BACKGROUND OF THE INVENTION

1. Field of the Invention

The present invention concerns a tunable diode laser system with external resonator in Littrow or Littman configuration. The system includes an optical lattice on which the light beam from a laser diode is diffracted, a support element to hold the lattice or to hold a mirror, which reflects the light diffracted by the lattice, and an actuator to change the position of the lattice or the mirror.

2. The Prior Art

The spectral bandwidth of the laser emission can be substantially reduced by the back-coupling of the light which is emitted by a laser diode of a diode laser with external resonator. An external resonator, furthermore, makes it possible to tune the laser wavelength. From the prior art, configurations are known with back-coupling via an optical lattice, on which the light generated by means of the laser diode is diffracted. The lattice can be arranged at the front end of the laser diode, i.e., in the useful beam, or at the back end of the laser diode, in which case the back-coupling occurs via the end facet of the laser diode.

For diode lasers in the so-called Littrow configuration, the light emitted by the laser diode is collimated by means of a collimation optics and diffracted on the optical lattice. The light of the zeroth diffraction order is taken out as the useful beam. The light of the first diffraction order is reflected back into the laser diode. In this way, the diffraction lattice and the end facet of the laser diode form a resonator.

The tuning of the wavelength for a diode laser in Littrow configuration occurs by rotating the optical lattice. This rotation produces a change in the angle of incidence of the laser beam on the lattice and, consequently, a variation in the wavelength of the resonantly back-coupled first diffraction order.

In order to tune the diode laser system free of mode hops, one must vary the length of the optical resonator at the same time as the angle of rotation of the diffraction lattice is changed, so that always the same laser mode prevails in the resonator. A coordinated changing of angle and length is realized precisely when the diffraction lattice is turned about a pivot center defined by the intersection of the planes of the surface of the optical lattice and the end facet of the laser diode.

In practice, such an axis of rotation unfortunately cannot be accurately realized, or it requires great expense to do so. Furthermore, the necessarily long turning arm of the diffraction lattice leads to a very large structural shape. As a result, the disadvantages occur that the system reacts sensitively to low frequency mechanical vibrations and can be thermally controlled only with difficulty. The long turning arm, furthermore, is a disadvantage, because the adjustment can easily be disturbed by the forces produced during transport.

Furthermore, diode laser systems are known in the so-called Littman configuration. In these systems, the laser beam emitted by a laser diode is likewise diffracted on an optical lattice, but the light of the first diffraction order impinges on a mirror, which reflects the light back onto the diffraction lattice. The mirror forms with the end facet of the laser diode an optical resonator. To tune the wavelength, the mirror is turned. This turning changes the angle between the diffracted beam of first order and the normal to the optical lattice, which dictates the resonance condition. For a tuning of the wavelength free of mode hops, the mirror in a diode laser system in the Littman configuration must be turned about a pivot center which is defined by the line of intersection of three planes. These planes are the plane of the end facet of the laser diode, the plane of the surface of the diffraction lattice, and the plane of the surface of the mirror. The accurate realization of this center of rotation requires, in practice, a very complicated mechanism. The fabrication and maintenance of such laser systems is accordingly costly and time-intensive. A flawless position of the center of rotation significantly limits the tuning range free of mode hops.

A tunable diode laser system of the above indicated kind, in which actuators are provided for the changing of the position of the lattice, is known from the prior art (J. Hult et al.: "Wide-bandwidth mode-hop-free tuning of extended-cavity GaN diode lasers", Applied Optics, Jun. 20, 2005, Vol. 44, No. 18, p. 3675-3679). In the known system, a support element is provided to support the diffraction lattice. The support element includes two piezo-actuators, which bring about a turning of the diffraction lattice and a synchronous changing of the length of the optical resonator. The turning occurs about a (virtual) center of rotation, which is defined by the actuation of the piezo-actuators. The disadvantage in this system is that it requires two separate piezo-actuators. The correct actuation of the piezo-actuators to realize a mode-hop-free tuning is complicated, which makes necessary an equally costly electronics. Thus, the system is elaborate and costly to produce.

SUMMARY OF THE INVENTION

Against this background, it is an object of the present invention to provide a tunable diode laser system which enables a reliable mode-hop-free tuning and furthermore is easy and economical to realize.

These and other objects are achieved, according to the invention, starting from a diode laser system of the above indicated kind, by having the support element include a carrier, on which the lattice or the mirror is arranged, and a base body, while the actuator acts on the carrier and rests against the base body, and the carrier is connected to the base body via linkages, such that a linear deflection of the actuator is transformed into a rotation of the carrier in the plane of the light beam, while the center of rotation lies outside the base body and/or outside the linkages.

In the diode laser system according to the invention, a continuous mode-hop-free tuning of the wavelength can occur via a single actuator. The diffraction lattice (in Littrow configuration) or the mirror (in Littman configuration) are reliably turned about the correct center of rotation. According to the invention, the support element includes a carrier for the lattice or for the mirror and a base body, while the carrier is connected to the base body by linkages. The arrangement and design of these linkages determines how the linear deflection of the actuator is transformed into a rotary motion of the carrier. The arrangement and design of the linkages and the position of the point of acting of the actuator on the carrier define the center of rotation in precise and reproducible manner. The center of rotation lies outside the linkages and/or outside the base body of the support element. As a result, the (virtual) center of rotation can lie outside the outer bound of the base body, which advantageously allows for an especially compact construction.

The laser system according to the invention makes do with a single actuator. An expensive actuation electronics for the coordinated deflection of several actuators is not needed in the system according to the invention. Moreover, the system according to the invention has only a few components, which can be made with relatively low cost, so that the overall system is economical in its manufacture.

A further benefit of the system according to the invention is that it is comparatively insensitive to mechanical vibrations, thanks to its compact dimensions.

Preferably, the linkages of the diode laser system according to the invention are elastic solid linkages, whose rigidity can be specifically dictated in terms of the lengths and the thicknesses of the linkage segments. The individual linkages can have different rigidity. The (virtual) center of rotation can be specifically dictated during the fabrication of the support element by appropriate dimensioning of the individual linkages, without having to otherwise adapt the mechanics. Furthermore, by the design of the linkages in terms of their rigidity, one can influence the mechanical resonance frequencies so that the sensitivity to mechanical oscillations is low and an especially fast tuning of the wavelength via the actuator is possible.

A further benefit of the solid linkages is that they work almost free of wear, which ensures a good long-term stability of the system. Thanks to the elastic properties of the solid linkages, furthermore, the servomechanism required for the turning of the lattice or mirror can be especially easily realized. In fact, for the turning one need only exert a force in one direction by means of the actuator, against the elastic restoring forces of the solid linkages. The restoring forces then automatically ensure the long-term stability of the tuning. Expediently, in the laser system according to the invention, the carrier and the base body are configured together as a single piece (monolithic). Familiar electric discharge techniques can be used for the fabrication, such as wire spark erosion. This feature, in turn, is beneficial for the costs and at the same time the compactness of the overall layout.

In one practical embodiment of the diode laser system according to the invention, at least one guide linkage having two translatory and one rotational degree of freedom and at least one rotary linkage are provided as the solid linkages. The rotary linkage has one translatory and one rotary degree of freedom. The guide linkage achieves a guiding of the carrier in the plane of the light beam, while the rotary linkage ensures that the linear deflection of the actuator is transformed into a rotation of the carrier about the desired center of rotation. The at least one guide linkage thus enables a translation and rotation in the plane of the light beam. The rotary linkage "shackles" the carrier to the base body, which brings about the transformation according to the invention of the linear deflection of the actuator into a rotation about the center of rotation, lying outside the base body. The solid linkages can be configured, for example, as plate or leaf spring linkages. Such linkages have translatory and rotary degrees of freedom. The bending rigidity of the linkage in the plane of the laser beam is advantageously smaller by orders of magnitude than in the direction perpendicular to this plane. Hence, one can specifically accomplish the guiding of the rotation of the lattice or the mirror, needed for the tuning.

An especially preferred embodiment of the tunable diode laser system according to the invention enables the position of the center of rotation to be adjusted by changing the position of the point of action of the actuator on the carrier. In the system according to the invention, the position of the center of rotation can be very easily made adjustable in that the position of the actuator and thus the position of the point of action of the actuator on the carrier can be changed. The adjustment can advantageously occur in that the position of the point of action is changed in a direction parallel to the lattice surface. In this way, the actual center of rotation can be made to coincide at least approximately with the theoretically ideal center of rotation. The invention uses the very definite influence that the position of the point of action has on the transformation of the linear deflection of the actuator into the rotation of the carrier on which the diffraction lattice or the mirror is fastened.

In the tunable diode laser system according to the invention, the actuator bringing about the tuning can be, in the most simple case, a manually activated setting screw. This screw is led into a matching thread in the base body of the support element and establishes the position of the carrier according to how deeply it is screwed in. Likewise, the actuator can be a linear servomotor or a linear piezo-actuator.

Especially preferred is an embodiment of the tunable diode laser system according to the invention in which the support element moreover includes a turning frame on which the base body is mounted and able to turn in the plane of the light beam. This embodiment also enables a very simple (rough) tuning of the laser system by rotation of the base body (and, thus, the lattice or the mirror) relative to the turning frame. The support element in this case is expediently configured so that the rotation of the optical lattice or of the mirror occurs about the point of incidence of the laser beam on the lattice or the mirror. In this case, a small lattice or a small mirror can be used. The lattice or mirror increases the resonance frequency of the layout thanks to the correspondingly small structural size of the carrier and thus lessens the sensitivity to mechanical (acoustical) oscillations.

An expedient modification of the tunable diode laser system according to the invention provides a diode holder to support the laser diode and a collimation optics. The diode holder encloses the laser diode and the collimation optics, and expediently the position of the laser diode relative to the collimation optics should be adjustable, in order to maintain the best possible laser beam. The diode holder can rotate in order to adjust the angle of incidence on the lattice. This adjustment primarily involves making sure that the light beam strikes the diffraction lattice in such a way that the desired back-coupling of the diffracted light into the laser diode is achieved. An especially expedient embodiment of the laser system according to the invention provides that the diode holder is mounted and can turn on the turning frame, and this turning takes place about an axis of rotation perpendicular to the axis of rotation of the base body. This arrangement achieves an overall very compact and closed construction. All components can be positioned and fixed relative to each other so that a high long-term stability of the adjustment is achieved. A high transport stability is assured, because few torques can be expected about the axis of rotation of the diode holder mounted on the turning frame.

Laser diodes in the sense of the invention are any semiconductor lasers, such as Fabry-Perot laser diodes, antireflex-coated (AR) laser diodes, diodes with trapezoidal geometry of the active zone, broad-stripe emitters or the like.

BRIEF DESCRIPTION OF THE DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Referring now in detail to the drawings, FIGS. 1-6 show a tunable diode laser system according to the invention with an external resonator in the Littrow configuration.

Figure 1:
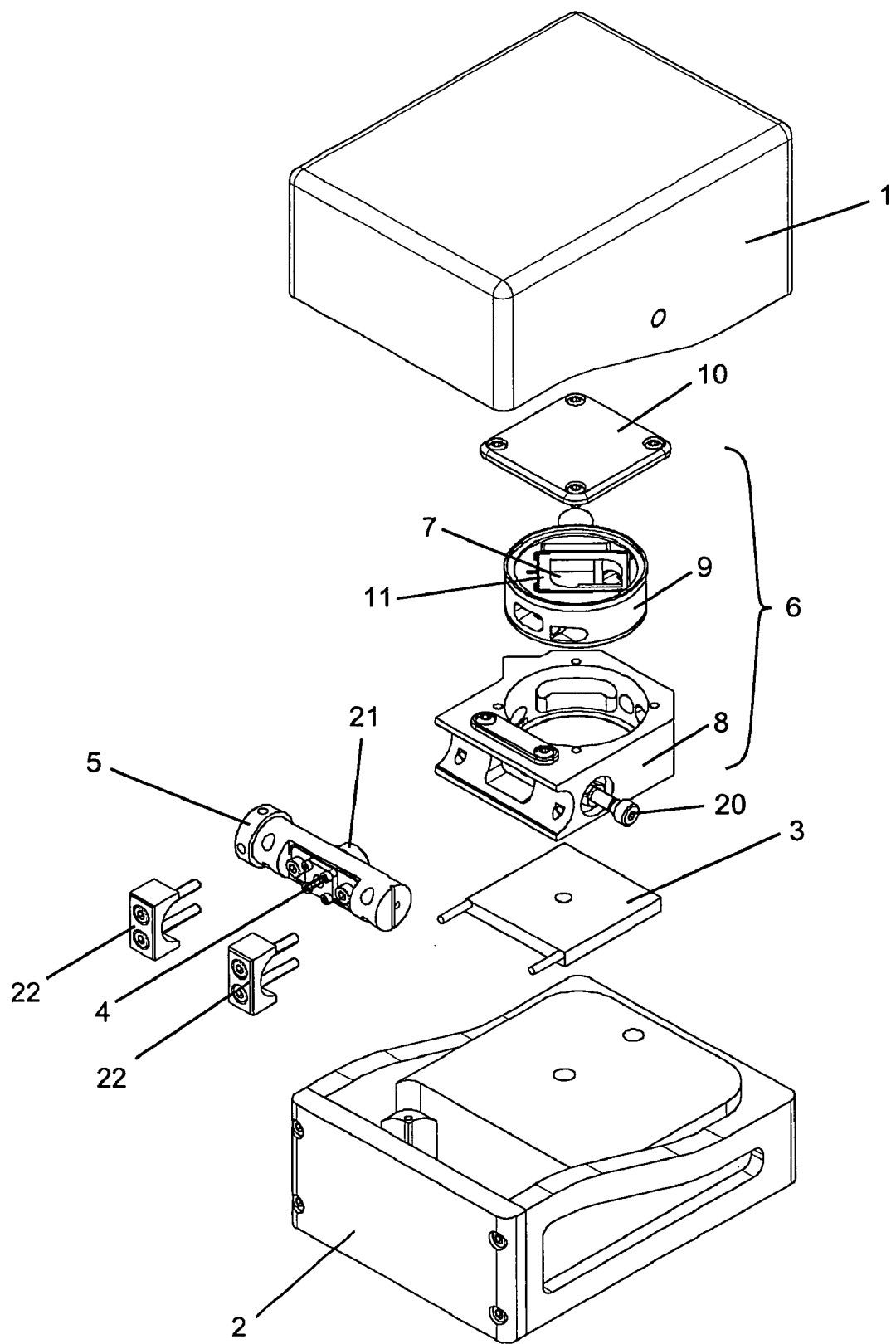
FIG. 1 is an exploded view of a diode laser system according to the invention in Littrow configuration.

The exploded diagram of FIG. 1 shows the major individual parts of the system. A cover 1 and a base plate 2 form the external housing of the system. In base plate 2, the electrical leads are accommodated. A Peltier element 3 serves for the temperature stabilization of the laser resonator. The central components of the diode laser system according to the invention are a laser diode 4, which is arranged on a diode holder 5, and a support element 6 for holding an optical lattice 7. The support element includes a turning frame 8 and a base body 9. Base body 9 is mounted on turning frame 8 and able to turn about a vertical axis of rotation. For this turning, the round circular base body 9 is inserted into the corresponding recess in turning frame 8. The wavelength of the light emitted by the diode laser system can be roughly tuned by turning base body 9 relative to turning frame 8. In this way, base body 9 will turn about the point of incidence of the laser light beam of laser diode 4 on diffraction lattice 7. A resonator cover 10 is screwed onto support element 6, in order to fix base body 9 in the vertical direction.

Figure 2:
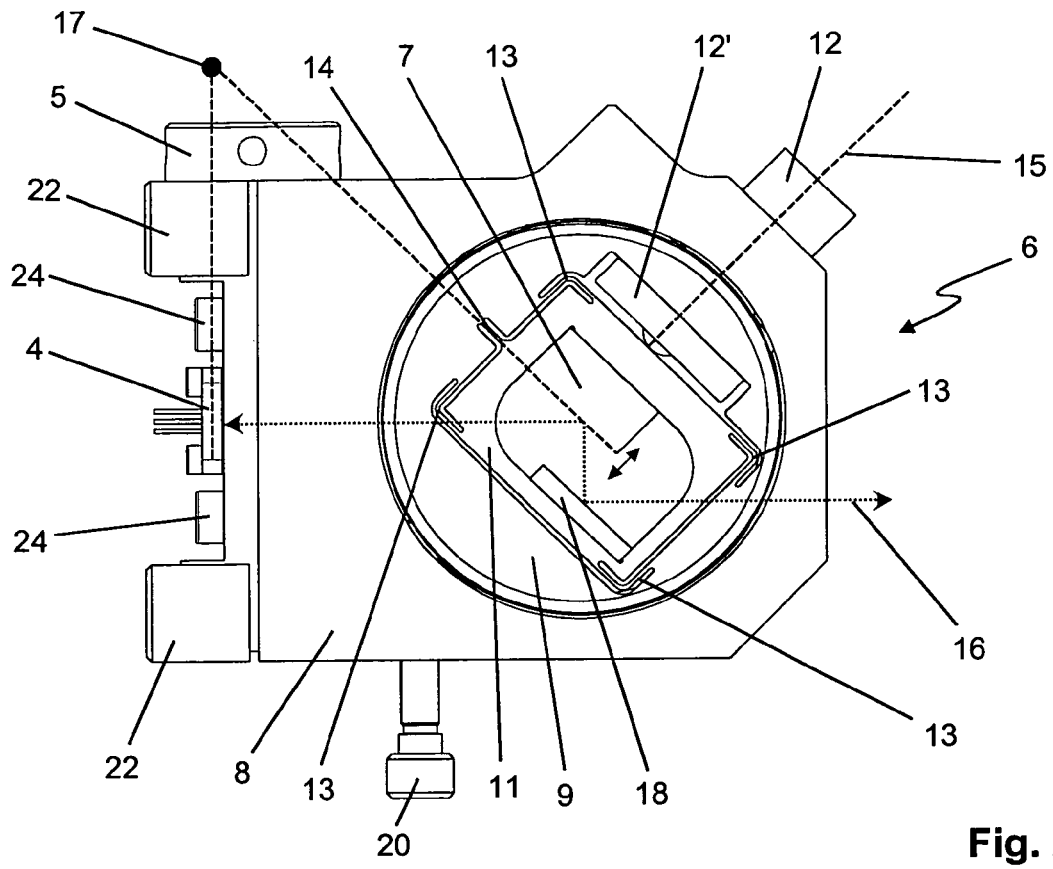
FIG. 2 is a top view of the support element of the laser system according to the invention, with a diode holder arranged on it.
Figure 3:
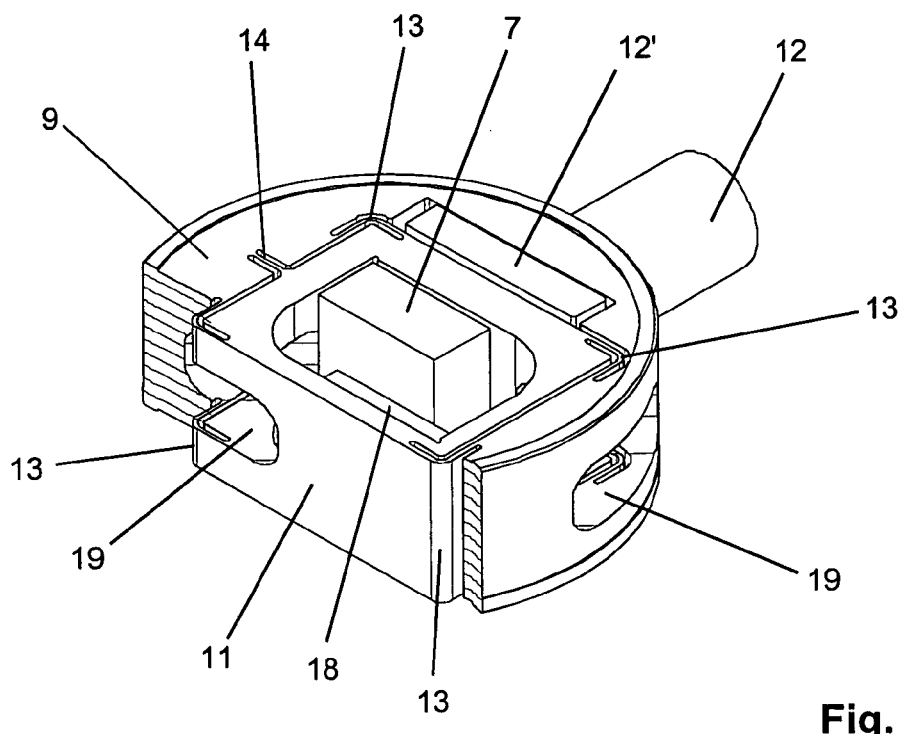
FIG. 3 is a partially sectioned top view of the base body and the carrier of the support element.

The central element of the diode laser according to the invention is support element 6, whose construction is presented in detail in FIGS. 2 and 3. Support element 6 includes a carrier 11 on which the optical lattice 7 is arranged. To change the position of lattice 7, a piezo-actuator 12 is provided, which rests against base body 9 and acts on carrier 11. Base body 9 is connected to carrier 11 by a total of five solid linkages. These linkages are four symmetrically arranged guide linkages 13 and one rotary linkage 14, which is set off to the side of deflection axis 15 of actuator 12.

The four guide linkages 13 serve to guide carrier 11 in the plane of light beam 16 of laser diode 4 and essentially determine the mechanical resonance frequencies of the system. Rotary linkage 14 ensures that a linear deflection of actuator 12 along axis 15 is converted into a rotation of carrier 11. The center 17 of this rotation will lie outside linkages 13, 14, as shown in FIG. 2, and also in particular outside the outer bounds of base body 9. The center of rotation is defined by the intersection of the plane of the surface of diffraction lattice 7 and the plane of the end facet of laser diode 4.

The turning about center of rotation 17 enables, as explained above, a mode-hop-free tuning of the laser wavelength. The position of center of rotation 17 can be adjusted by changing the position of the point of action of actuator 12 on carrier 11 in a direction parallel to the plane of lattice 7 and also parallel to rotary linkage 14. In the exemplary embodiment depicted, rotary linkage 14 lies in the plane of lattice 7. The point of action is defined by the point of intersection of the axis of deflection 15 of actuator 12 with the lateral surface of carrier 11. By simple shifting of a piezo-plate 12' of actuator 12, the point of action can be varied. In this way, the position of center of rotation 17 can be fine tuned and (at least approximately) aligned with the theoretically ideal center of rotation.

FIG. 2 shows the beam path of the laser light. Laser beam 16 impinges on diffraction lattice 7. The light of the zeroth diffraction order is taken out as the useful beam and exits the laser system. The first diffraction order, on the other hand, is reflected back into laser diode 4 so that lattice 7 and the end facet of laser diode 4 form an optical resonator. The useful beam is additionally reflected on a tilted mirror 18. Tilted mirror 18, as can be seen from the figures, is arranged on carrier 11, so that the position of tilted mirror 18 relative to diffraction lattice 7 is fixed. The tilted mirror compensates for the change in angle of the laser beam when tuning the laser system. The change in angle is transformed into a slight beam offset.

As can be seen in FIG. 3, light entry and exit openings 19 for the laser beam are formed in base body 9 and in carrier 11. Turning frame 8 has openings corresponding to these openings 19. Thus, overall, the laser beam is guided through the interior of support element 6.

For the rough tuning, as explained above, base body 9 is mounted and can turn on turning frame 8. A mechanical set screw 20, which can be screwed into turning frame 8, serves for the tuning. Set screw 20 acts on base body 9, and against the force of a restoring spring (not shown). The turning occurs about a vertical axis, which runs through the point of incidence of laser beam 16 on lattice 7. This arrangement makes it possible to use a small-size diffraction lattice 7, so that overall a very compact construction is achieved.

Figure 4:
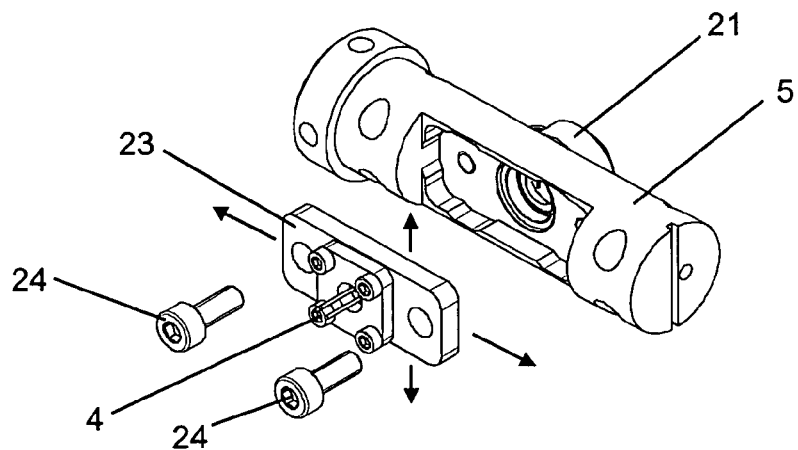
FIG. 4 shows mounting of the laser diode on the diode holder.
Figure 5:
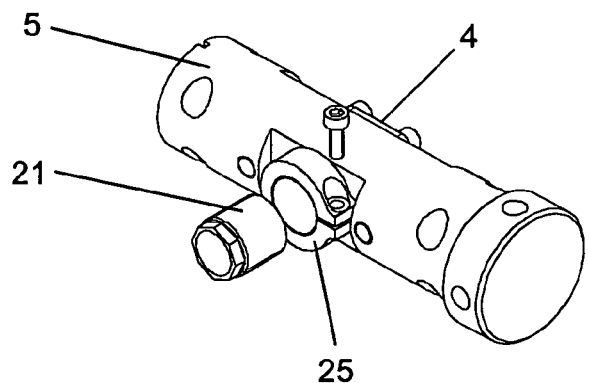
FIG. 5 shows mounting of the collimation optics on the diode holder.
Figure 6:
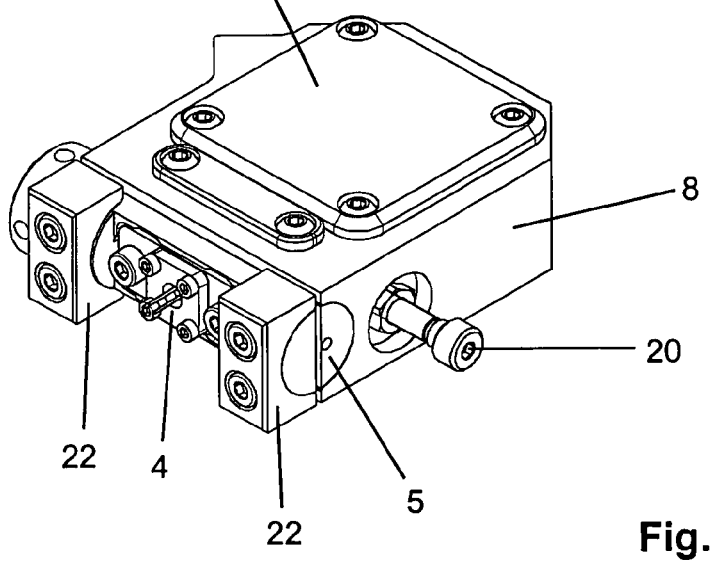
FIG. 6 is a top view of the support element of the diode laser system according to the invention with diode holder fastened to it.

FIGS. 4 and 5 show in detail diode holder 5 of the laser system according to the invention. Diode holder 5 serves to support laser diode 4 and collimation optics 21. Diode holder 5 is essentially cylindrical in shape (at least in the regions where it is guided on turning frame 8). Turning frame 8 has a (semi)cylindrical recess at its side, corresponding to the shape of diode holder 5. This recess receives diode holder 5, as is shown in FIGS. 6 and 7. Clamping blocks 22 which can be screwed to turning frame 8 serve to secure diode holder 5 to turning frame 8. In this way, the diode holder is mounted on turning frame 8 and can turn about a horizontal axis.

The direction of the laser beam can be adjusted in a vertical plane, in order to achieve the back-coupling of the light diffracted by optical lattice 7 into laser diode 4. Diode holder 5 is fixed in the desired position by means of clamping blocks 22. The adjustment, once performed, has a good long-term stability, because torques about the axis of rotation of diode holder 5 can hardly occur, even under strong mechanical stresses, such as impacts during transport. Thanks to the large contact surfaces between diode holder 5 and turning frame 8, a good heat transfer is assured. The overall very compact and enclosed unit of diode holder 5, turning frame 8, base body 9, carrier 11 and resonator cover 10 produces an extremely slight thermal frequency drift of the laser system, as well as a slight sensitivity to low-frequency (acoustic) mechanical oscillations.

As FIGS. 4 and 5 furthermore show, laser diode 4 can be adjusted in the transverse direction relative to collimation optics 21 by means of a clamping plate 23. Clamping plate 23 is fixed to diode holder 5 in the desired position by means of two screws 24. Collimation optics 21 can move parallel to the optical axis. By means of a clamping ring 25, the collimation optics can be permanently fixed in the desired direction. In the most elementary case, the collimation optics is a lens.

Accordingly, although only at least one embodiment of the present invention has been shown and described, it is to be understood that many changes and modifications may be made thereunto without departing from the spirit and scope of the invention as defined in the appended claims.

What is claimed is:

1. A tunable diode laser system with an external resonator in Littrow configuration comprising:
   (a) an optical lattice;
   (b) a laser diode emitting a light beam diffracted on said optical lattice;
   (c) a support element holding said optical lattice;
   (d) an actuator for changing position of said optical lattice; and
   (e) a plurality of linkages;
   wherein the support element comprises a base body and a carrier, said optical lattice being arranged on said carrier, said actuator acting on said carrier and resting against said base body, and said carrier being connected to said base body via said linkages so that a linear deflection of the actuator is transformed into a rotation of the carrier in a plane of the light beam and a center of rotation lies outside the linkages and outside the base body.

2. A tunable diode laser system with an external resonator in Littman configuration comprising:
   (a) an optical lattice;
   (b) a laser diode emitting a light beam diffracted on said optical lattice;
   (c) a mirror reflecting the light beam diffracted by said optical lattice;
   (d) a support element holding said mirror;
   (e) an actuator for changing position of said mirror; and
   (f) a plurality of linkages;
   wherein the support element comprises a base body and a carrier, said mirror being arranged on said carrier, said actuator acting on said carrier and resting against said base body, and said carrier being connected to said base body via said linkages so that a linear deflection of the actuator is transformed into a rotation of the carrier in a plane of the light beam and a center of rotation lies outside the linkages and outside the base body.

3. The tunable diode laser system according to claim 1, wherein the linkages are solid linkages.

4. The tunable diode laser system according to claim 2, wherein the linkages are solid linkages.

5. The tunable diode laser system according to claim 3, wherein the solid linkages have different rigidity.

6. The tunable diode laser system according to claim 4, wherein the solid linkages have different rigidity.

7. The tunable diode laser system according to claim 3, wherein the solid linkages comprise at least one guide linkage having two translatory and one rotational degree of freedom and at least one rotary linkage having one translatory and one rotary degree of freedom.

8. The tunable diode laser system according to claim 4, wherein the solid linkages comprise at least one guide linkage having two translatory and one rotational degree of freedom and at least one rotary linkage having one translatory and one rotary degree of freedom.

9. The tunable diode laser system according to claim 3, wherein the solid linkages comprise plate or leaf spring linkages.

10. The tunable diode laser system according to claim 4, wherein the solid linkages comprise plate or leaf spring linkages.

11. The tunable diode laser system according to claim 1, wherein the center of rotation can be adjusted in position by changing where the actuator acts on the carrier.

12. The tunable diode laser system according to claim 1, wherein the actuator is a linear servomotor, a linear piezo-actuator, or a setting screw.

13. The tunable diode laser system according to claim 1, wherein only one actuator is provided.

14. The tunable diode laser system according to claim 1, wherein the support element further comprises a turning frame, the base body being mounted on said turning frame and turnable in the plane of the light beam.

15. The tunable diode laser system according to claim 14, wherein the light emitted by the diode laser system has a wavelength tunable by turning the base body relative to the turning frame.

16. The tunable diode laser system according to claim 1, further comprising a diode holder for supporting the laser diode and a collimation optics, the diode holder being rotatable in order to adjust an angle of incidence of the light beam on the optical lattice.

17. The tunable diode laser system according to claim 16, wherein the diode holder is mounted and tunable on the turning frame about an axis of rotation perpendicular to an axis of rotation of the base body.

18. A diode laser system with an external resonator in Littrow configuration comprising:
   (a) an optical lattice;
   (b) a laser diode emitting a light beam diffracted on said optical lattice;
   (c) a support element holding said optical lattice; and
   (d) a diode holder supporting the laser diode;
   wherein the diode holder is mounted and rotatable on the support element in order to adjust an angle of incidence of the light beam on the optical lattice.

19. The diode laser system according to claim 18, wherein the diode holder has a substantially cylindrical shape and the support element has a recess corresponding to said shape to accommodate the diode holder.

20. The diode laser system according to claim 18, further comprising at least one clamping block removably connected to the support element for fixing the diode holder on the support element.

* * * * *